(12) United States Patent
Lu et al.

(10) Patent No.: US 11,087,706 B2
(45) Date of Patent: Aug. 10, 2021

(54) DISPLAY DRIVING CIRCUIT HAVING SOURCE AUXILIARY CIRCUIT AND GATE AUXILIARY CIRCUIT AND DRIVING METHOD THEREOF, DISPLAY PANEL AND DISPLAY DEVICE

(71) Applicants: HEFEI BOE DISPLAY TECHNOLOGY CO., LTD., Anhui (CN); BOE TECHNOLOGY GROUP CO., LTD., Beijing (CN)

(72) Inventors: Siying Lu, Beijing (CN); Xiuqin Yang, Beijing (CN); Dong Liu, Beijing (CN); Jilei Gao, Beijing (CN)

(73) Assignees: HEFEI BOE DISPLAY TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/441,758

(22) Filed: Jun. 14, 2019

(65) Prior Publication Data

US 2020/0020294 A1    Jan. 16, 2020

(30) Foreign Application Priority Data

Jul. 13, 2018    (CN) .......................... 201810771790.1

(51) Int. Cl.
*G09G 3/36*    (2006.01)
*G11C 19/28*    (2006.01)

(52) U.S. Cl.
CPC ... *G09G 3/3677* (2013.01); *G09G 2310/0243* (2013.01); *G09G 2310/0286* (2013.01); *G11C 19/28* (2013.01)

(58) Field of Classification Search
CPC .............. G09G 3/3677; G09G 3/3688; G09G 2310/0248; G09G 2320/0257;
(Continued)

(56) References Cited

U.S. PATENT DOCUMENTS

2013/0249966 A1 * 9/2013 Li
2014/0022232 A1 * 1/2014 Uehata

FOREIGN PATENT DOCUMENTS

CN    101071215 A    11/2007
CN    101561603 A    10/2009
(Continued)

OTHER PUBLICATIONS

First Office Action dated May 29, 2020, for corresponding Chinese application 201810771790.1.

*Primary Examiner* — Yaron Cohen
(74) *Attorney, Agent, or Firm* — Nath, Goldberg & Meyer; Joshua B. Goldberg

(57) ABSTRACT

The present disclosure provides a display driving circuit and a driving method thereof, a display panel, and a display device. The display driving circuit comprises: a gate auxiliary circuit configured to selectively output one of a data signal from a source driver and a common voltage signal in response to a first control signal; and a gate auxiliary circuit configured to selectively output one of a scan signal from a gate driver and an active level signal in response to a second control signal, the active level signal being a signal enabling a corresponding switch transistor to be turned on.

17 Claims, 8 Drawing Sheets

(58) Field of Classification Search
CPC ... G09G 2320/0247; G09G 2310/0286; G09G 2310/0243; G11C 19/28
See application file for complete search history.

(56) References Cited

FOREIGN PATENT DOCUMENTS

| | | |
|---|---|---|
| CN | 102034439 A | 4/2011 |
| CN | 203811952 U | 9/2014 |
| CN | 104503113 A | 4/2015 |
| CN | 104616615 A | 5/2015 |
| CN | 105185293 A | 12/2015 |
| CN | 106019735 A | 10/2016 |
| JP | 3568644 B2 | 9/2004 |

* cited by examiner

DISPLAY DRIVING CIRCUIT HAVING SOURCE AUXILIARY CIRCUIT AND GATE AUXILIARY CIRCUIT AND DRIVING METHOD THEREOF, DISPLAY PANEL AND DISPLAY DEVICE

TECHNICAL FIELD

The present disclosure relates to display technology, more particularly, to a display driving circuit and a driving method thereof, a display panel and a display device.

BACKGROUND

In the field of display technology, for example, a pixel array of a liquid crystal display panel generally includes a plurality of rows of gate lines and a plurality of columns of data lines intersecting therewith. The gate lines may be driven by an integrated driving circuit.

In recent years, with the continuous improvement of the manufacture process of the amorphous silicon thin film transistor or oxide thin film transistor, the gate line driving circuit can be directly integrated to a thin film transistor array substrate to form a gate drive circuit (GOA, Gate driver On Array) for driving the gate lines.

SUMMARY

The present disclosure provides a display driving circuit including: a source auxiliary circuit configured to selectively output one of a data signal from a source driver and a common voltage signal in response to a first control signal; and a gate auxiliary circuit configured to selectively output one of a scan signal from a gate driver and an active level signal in response to a second control signal, the active level signal being a signal enabling a corresponding switch transistor to be turned on.

According to an embodiment of the present disclosure, the source auxiliary circuit includes an inverter, a first switch transistor and a second switch transistor, the first switch transistor and the second switch transistor have a same conductivity type; an input terminal of the inverter is coupled to a first control signal terminal that provides the first control signal; a control electrode of the first switch transistor is coupled to an output terminal of the inverter, a first electrode of the first switch transistor is coupled to the source driver, and a second electrode of the first switch transistor is coupled to an output terminal of the source auxiliary circuit; a control electrode of the second switch transistor is coupled to the first control signal terminal, a first electrode of the second switch transistor is coupled to the output terminal of the source auxiliary circuit, and a second electrode of the second switch transistor is coupled to a common voltage signal terminal that provides the common voltage signal.

According to an embodiment of the present disclosure, the inverter includes a first resistor, a second resistor, a third resistor, an operational amplifier and a first capacitor; a first terminal of the first resistor is coupled to the first control signal terminal, and a second terminal of the first resistor is coupled to an inverting input terminal of the operational amplifier; a first terminal of the second resistor is coupled to a first terminal of the first capacitor and the inverting input terminal of the operational amplifier, and a second terminal of the second resistor is coupled to a second terminal of the first capacitor and an output terminal of the operational amplifier; a first terminal of the third resistor is coupled to a non-inverting input terminal of the operational amplifier, and a second terminal of the third resistor is grounded; and the output terminal of the operational amplifier is coupled to the control electrode of the first switch transistor.

According to an embodiment of the present disclosure, the source auxiliary circuit includes a first switch transistor and a second switch transistor, the first switch transistor and the second switch transistor having different conductivity types; a control electrode of the first switch transistor is coupled to a first control signal terminal that provides the first control signal, a first electrode of the first switch transistor is coupled to the source driver, and a second electrode of the first switch transistor is coupled to an output terminal of the source auxiliary circuit; a control electrode of the second switch transistor is coupled to the first control signal terminal, a first electrode of the second switch transistor is coupled to the output terminal of the source auxiliary circuit, and a second electrode of the second switch transistor is coupled to a common voltage signal terminal that provides the common voltage signal.

According to an embodiment of the present disclosure, the gate auxiliary circuit includes a third switch transistor, a control electrode of the third switch transistor being coupled to a second control signal terminal that provides the second control signal, a first electrode of the third switch transistor being coupled to an active level signal terminal that provides the active level signal, and a second electrode of the third switch transistor being coupled to the gate driver.

According to an embodiment of the present disclosure, the gate auxiliary circuit includes a third switch transistor, a control electrode and a first electrode of the third switch transistor being coupled to a second control signal terminal that provides the second control signal, and a second electrode of the third switch transistor being coupled to the gate driver.

According to an embodiment of the present disclosure, the source auxiliary circuit and the gate auxiliary circuit have a same circuit structure.

According to an embodiment of the present disclosure, the first control signal and the second control signal are a same signal.

According to an embodiment of the present disclosure, the gate driver includes N cascaded shift register units, which each include one scan signal terminal, where N is an integer greater than 2, and the gate driver outputs the scan signal through the scan signal terminal.

According to an embodiment of the present disclosure, the source auxiliary circuit includes a first resistor, a second resistor, a third resistor, a first switch transistor, a second switch transistor, an operational amplifier and a first capacitor, the first switch transistor and the second switch transistor have a same conductivity type, and the gate auxiliary circuit includes a third switch transistor; a first terminal of the first resistor is coupled to a first control signal terminal that provides the first control signal, a second terminal of the first resistor is coupled to an inverting input terminal of the operational amplifier; a first terminal of the second resistor is coupled to a first terminal of the first capacitor and the inverting input terminal of the operational amplifier, and a second terminal of the second resistor is coupled to a second terminal of the first capacitor and an output terminal of the operational amplifier; a first terminal of the third resistor is coupled to a non-inverting input terminal of the operational amplifier, and a second terminal of the third resistor is grounded; a control electrode of the first switch transistor is coupled to the output terminal of the operational amplifier, a first electrode of the first switch transistor is coupled to the source driver, and a second electrode of the first switch transistor is coupled to an output terminal of the source auxiliary circuit; a control electrode of the second switch transistor is coupled to the first control signal terminal, a first electrode of the second switch transistor is coupled to the output terminal of the source auxiliary circuit, and a second electrode of the second switch transistor is coupled to a common voltage signal terminal that provides the common voltage signal; and a control electrode of the third switch transistor is coupled to a second control signal terminal that provides the second control signal, a first electrode of the third switch transistor is coupled to an active level signal terminal that provides the active level signal, and a second electrode of the third switch transistor is coupled to the gate driver.

In another aspect, the present disclosure further provides a display panel including a display driving circuit according to the present disclosure.

In another aspect, the present disclosure further provides a display device including a display panel according to the present disclosure.

In another aspect, the present disclosure further provides a driving method of a display panel having a display period for displaying an image and a supplemental period after the display period, the display panel including a plurality of sub-pixels which each include a pixel electrode and a common electrode that is supplied with a common voltage signal, the driving method including: providing the common voltage signal to the pixel electrodes during the supplemental period.

According to an embodiment of the present disclosure, the display panel is driven by the display driving circuit according to the present disclosure; during the display period, the source auxiliary circuit provides a data signal from the source driver to the display panel in response to a first control signal, and the gate auxiliary circuit provides a scan signal from a gate driver to the display panel in response to a second control signal, so that the display panel displays an image; during the supplemental period, the source auxiliary circuit provides the common voltage signal to the display panel in response to the first control signal, and the gate auxiliary circuit provides an active level signal to the display panel in response to the second control signal, to provide the common voltage signal to the pixel electrode of each sub-pixel.

According to an embodiment of the present disclosure, the source auxiliary circuit includes an inverter, a first switch transistor and a second switch transistor, the first switch transistor and the second switch transistor having the same conductivity type; an input terminal of the inverter is coupled to a first control signal terminal that provides the first control signal, a control electrode of the first switch transistor is coupled to an output terminal of the inverter, a first electrode of the first switch transistor is coupled to the source driver, and a second electrode of the first switch transistor is coupled to an output terminal of the source auxiliary circuit; a control electrode of the second switch transistor is coupled to the first control signal terminal, a first electrode of the second switch transistor is coupled to the output terminal of the source auxiliary circuit, and a second electrode of the second switch transistor is coupled to a common voltage signal terminal that provides the common voltage signal.

According to an embodiment of the present disclosure, the inverter includes a first resistor, a second resistor, a third resistor, an operational amplifier and a first capacitor; a first terminal of the first resistor is coupled to the first control signal terminal, and a second terminal of the first resistor is coupled to an inverting input terminal of the operational amplifier; a first terminal of the second resistor is coupled to a first terminal of the first capacitor and the inverting input terminal of the operational amplifier, and a second terminal of the second resistor is coupled to a second terminal of the first capacitor and an output terminal of the operational amplifier, a first terminal of the third resistor is coupled to a non-inverting input terminal of the operational amplifier, and a second terminal of the third resistor is grounded; and an output terminal of the operational amplifier is coupled to the control electrode of the first switch transistor.

According to an embodiment of the present disclosure, the source auxiliary circuit includes a first switch transistor and a second switch transistor, the first switch transistor and the second switch transistor having different conductivity types; a control electrode of the first switch transistor is coupled to a first control signal terminal that provides the first control signal, a first electrode of the first switch transistor is coupled to the source driver, and a second electrode of the first switch transistor is coupled to an output terminal of the source auxiliary circuit; and a control electrode of the second switch transistor is coupled to the first control signal terminal, a first electrode of the second switch transistor is coupled to the output terminal of the source auxiliary circuit, and a second electrode of the second switch transistor is coupled to a common voltage signal terminal that provides the common voltage signal.

According to an embodiment of the present disclosure, the gate auxiliary circuit includes a third switch transistor, a control electrode of the third switch transistor being coupled to a second control signal terminal that provides the second control signal, a first electrode of the third switch transistor being coupled to an active level signal terminal that provides the active level signal, and a second electrode of the third switch transistor being coupled to the gate driver.

According to an embodiment of the present disclosure, the gate auxiliary circuit includes a third switch transistor, a control electrode and a first electrode of the third switch transistor being coupled to a second control signal terminal that provides the second control signal, and a second electrode of the third switch transistor being coupled to the gate driver.

According to an embodiment of the present disclosure, the first control signal and the second control signal are a same signal.

BRIEF DESCRIPTION OF THE FIGURES

The following drawings are merely examples for illustrative purposes according to various disclosed embodiments and are not intended to limit the scope of the present disclosure.

DETAILED DESCRIPTION

Figure 1:
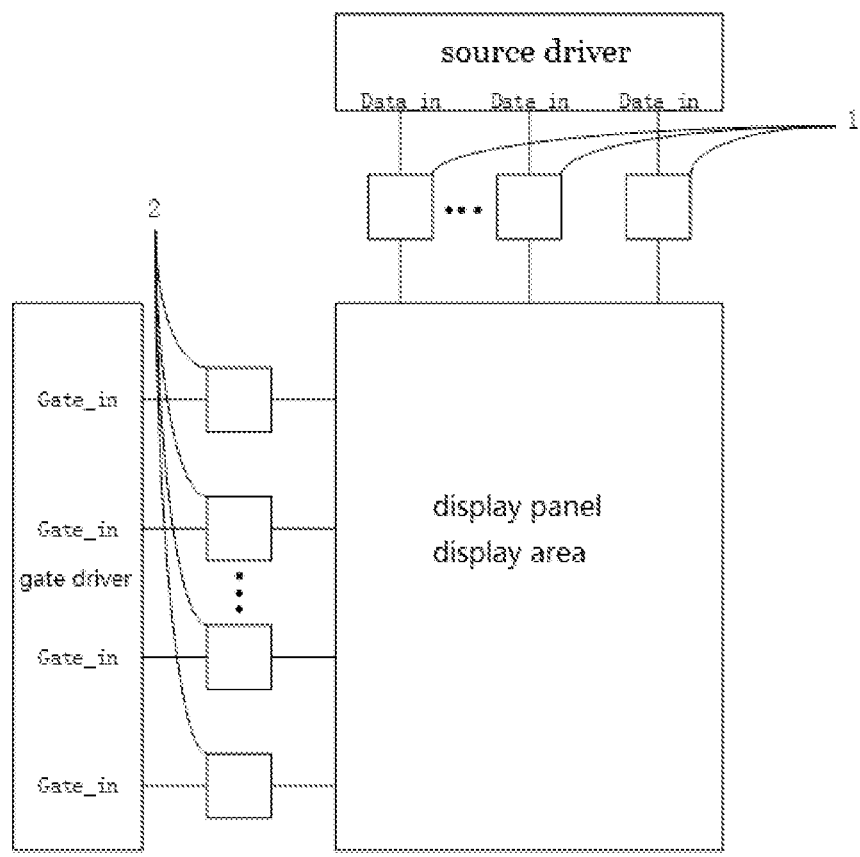
FIG. 1 is a schematic diagram illustrating a structure of a display driving circuit according to some embodiments of the present disclosure.

In order to make objects, technical solutions and advantages of the embodiments of the present disclosure more clear, the technical solutions of the embodiments of the present disclosure will be clearly and completely described below in conjunction with the drawings of the embodiments of the present disclosure. It is apparent that the described embodiments are a part of, rather than all of, the embodiments of the present disclosure. All other embodiments obtained by those of ordinary skill in the art based on the described embodiments of the present disclosure without creative effort are within the scope of the present disclosure.

Unless otherwise defined, technical or scientific terms used in the present disclosure should have the same meaning as commonly understood by those of ordinary skill in the art. The words such as "first", "second", and the like used in the present disclosure do not denote any order, quantity, or importance, but are used to distinguish different components. Similarly, the words such as "a", "an", "the" and the like do not denote a limitation to quantity, but rather means that there is at least one. The word such as "comprising", "including" or the like means that element(s) or object(s) preceding the word encompasses element(s), object(s) and their equivalents listed after the word, and do not exclude other elements or objects. The words such as "coupled", "connected" and the like are not limited to physical or mechanical connection, but may comprise electrical connection, regardless of being direct or indirect. The words such as "upper", "lower", "left", "right" and the like are only used to indicate a relative positional relationship, and when an absolute position of object(s) described is changed, the relative positional relationship may also change accordingly.

The present disclosure is described below with reference to a few specific embodiments. In order to keep the following description of the embodiments of the present disclosure clear and concise, detailed descriptions of known functions and components may be omitted. When any component of an embodiment of the present disclosure appears in more than one drawing, the component is denoted by a same reference numeral in each drawing.

In general, for example, a GOA composed of a plurality of cascaded shift register units can be used to provide on/off voltage signals to a plurality of rows of gate lines of a pixel array to control the plurality of rows of gate lines to be sequentially turned on, thereby achieving row-by-row scanning. In general, in source driving, the source driver outputs a signal to each data line directly, the gate driving and source driving are performed simultaneously, and the source driver drives each column of data lines to provide a data signal to a corresponding row of pixel units when the gate driver drives respective rows of gate lines to be turned on row by row, thereby generating, in each pixel unit, a grayscale voltage required for displaying a corresponding grayscale of an image, so as to display the image. However, since a bias voltage formed on a pixel electrode and a common electrode cannot be completely eliminated after displaying one frame of image, a voltage residual is caused, resulting in image sticking after displaying one frame of image or a flicker phenomenon when inputting the next frame signal.

Accordingly, the present disclosure provides, inter alia, a display driving circuit and a driving method thereof, a display panel and a display device that substantially obviate one or more of the problems due to limitations and disadvantages of the related art. In the present disclosure, all gates are turned on by the gate auxiliary circuit after displaying one frame of image, and in the meanwhile, a common voltage signal is input to all of the pixel electrodes through the source auxiliary circuit. On one hand, this can help to release the residual voltage on the pixel electrode. On the other hand, this can also eliminate the voltage difference between the pixel electrode and the common electrode, avoid light leakage, and reduce write load when inputting a data signal for displaying the next frame of image, thus reducing power consumption.

In one aspect, the present disclosure provides a display driving circuit. In some embodiments, the display driving circuit includes: a source auxiliary circuit configured to selectively output one of a data signal from a source driver and a common voltage signal in response to a first control signal; and a gate auxiliary circuit configured to selectively output one of a scan signal from a gate driver and an active level signal in response to a second control signal, the active level signal being a signal enabling a corresponding switch transistor to be turned on.

FIG. 1 is a schematic view illustrating a structure of a display driving circuit according to some embodiments of the present disclosure. Referring to FIG. 1, the display driving circuit includes a gate driver and a source driver. In some embodiments, the gate driver can be a plurality of cascaded shift register units or an integrated driver chip, and the source driver can also be an integrated driver chip, although the present disclosure is not limited thereto.

In some embodiments, as shown in FIG. 1, the gate driver includes a plurality of first scan signal terminals Gate_in, and one gate auxiliary circuit 2 is coupled between each of the first scan signal terminals Gate_in and the display area of the display panel. Further, the source driver includes a plurality of first data signal terminals Data_in, and one source auxiliary circuit 1 is coupled between each of the first data signal terminals Data_in and the display area of the display panel.

Figure 2:
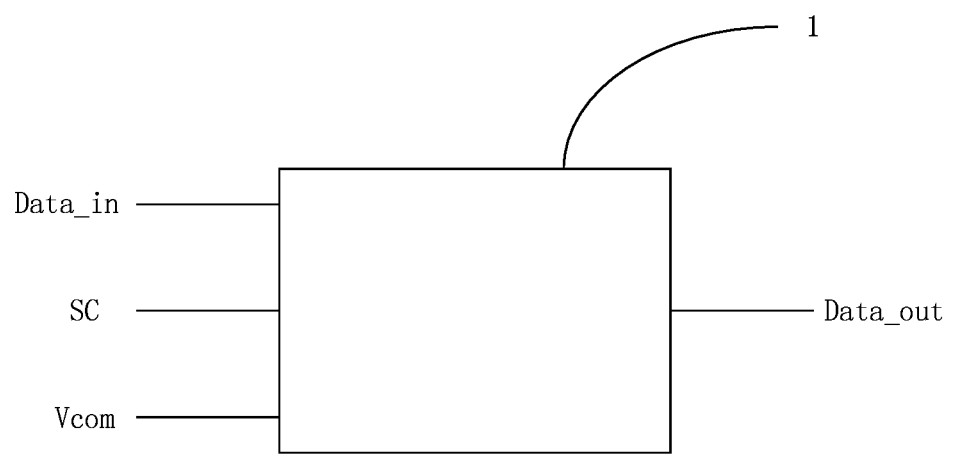
FIG. 2 is a schematic diagram illustrating a source auxiliary circuit according to some embodiments of the present disclosure.

FIG. 2 is a schematic diagram illustrating a source auxiliary circuit according to some embodiments of the present disclosure. In some embodiments, referring to FIG. 2, the source auxiliary circuit 1 is configured to output a second data signal to the display area of the display panel in response to a source auxiliary control signal, the common voltage signal and a first data signal. In some embodiments, the source auxiliary circuit 1 shown in FIG. 2 can be implemented as the circuit structure shown in FIG. 3.

Figure 3:
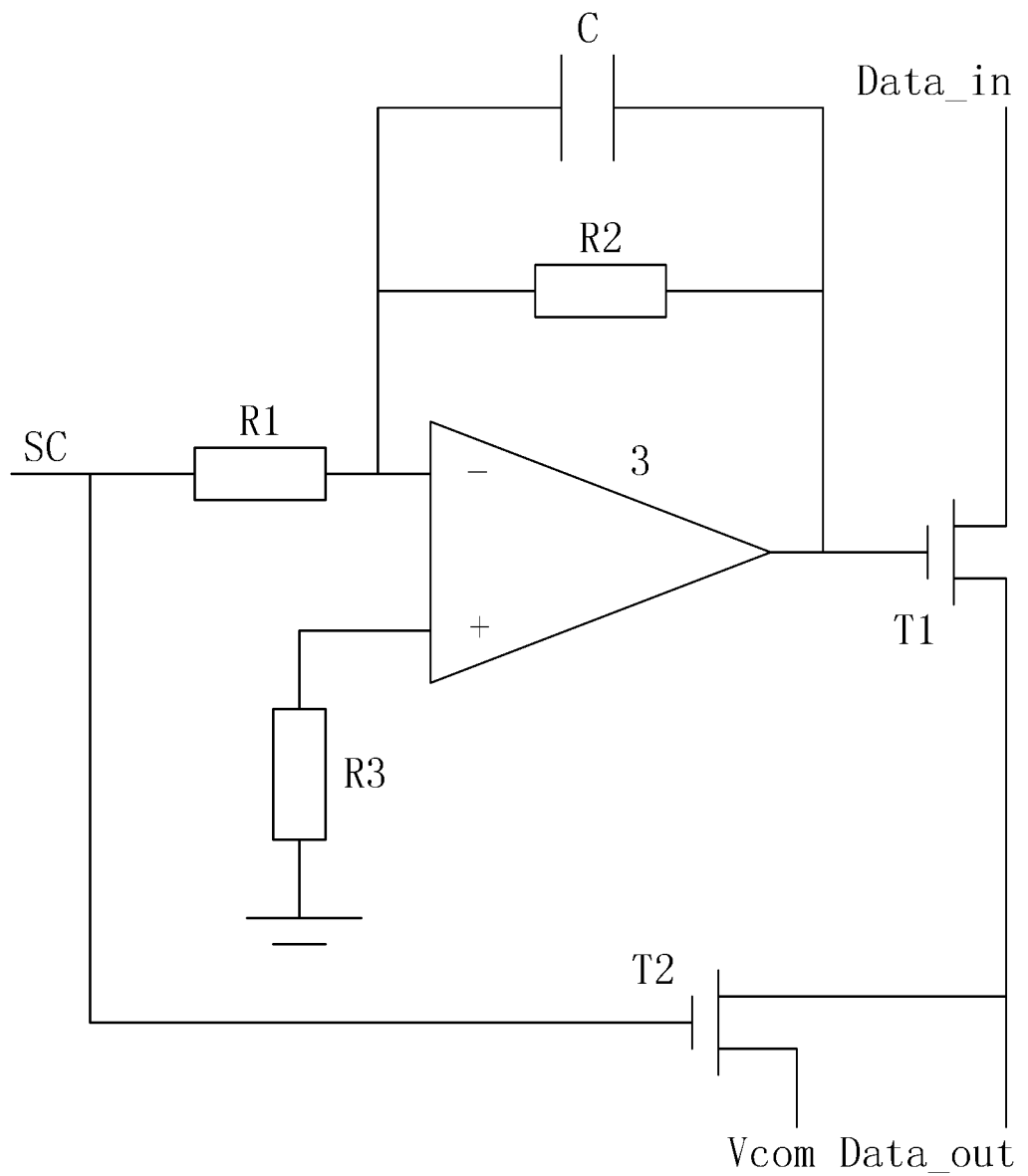
FIG. 3 is a schematic diagram illustrating a source auxiliary circuit according to some embodiments of the present disclosure.

FIG. 3 is a schematic diagram illustrating a source auxiliary circuit according to some embodiments of the present disclosure. In some embodiments, as shown in FIG. 3, the source auxiliary circuit 1 may include a first resistor R1, a second resistor R2, a third resistor R3, an operational amplifier 3, a first capacitor C, a first switch transistor T1, and a second switch transistor T2. The first switch transistor T1 and the second switch transistor T2 have the same conductivity type. One terminal of the first resistor R1 is coupled to a source auxiliary control signal terminal SC that provides the source auxiliary control signal, and the other terminal of the first resistor R1 is coupled to an inverting input terminal of the operational amplifier 3; one terminal of the second resistor R2 is coupled to one terminal of the capacitor C and the inverting input terminal of the operational amplifier 3, the other terminal of the second resistor R2 is coupled to the other terminal of the first capacitor C and an output terminal of the operational amplifier 3; one terminal of the third resistor R3 is coupled to a non-inverting input terminal of the operational amplifier 3, and the other terminal of the third resistor R3 is grounded; a control electrode of the first switch transistor T1 is coupled to the output terminal of the operational amplifier 3, a first electrode of the first switch transistor T1 is coupled to the first data signal terminal Data_in that provides the first data signal, a second electrode of the first switch transistor T1 is coupled to a second data signal terminal Data_out that outputs the second data signal; a control electrode of the second switch transistor T2 is coupled to the source auxiliary control signal terminal SC, a first electrode of the second switch transistor T2 is coupled to the second data signal terminal Data_out, and a second electrode of the second switch transistor T2 is coupled to the common voltage signal terminal Vcom that provides the common voltage signal.

The operation principle of the source auxiliary circuit 1 shown in FIG. 3 will be further explained below with reference to FIG. 7.

Figure 7:
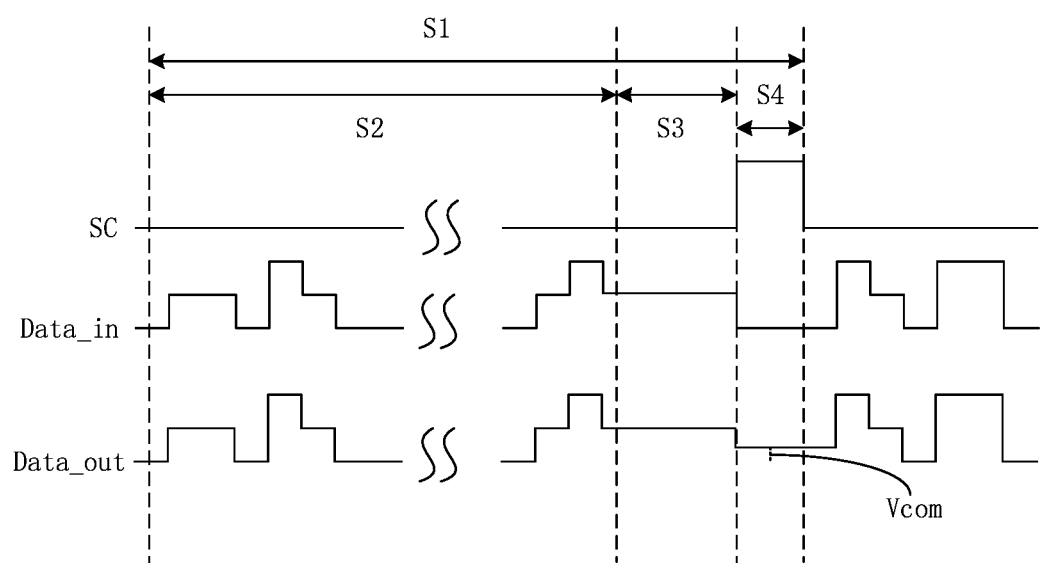
FIG. 7 is a timing diagram for operation of a display driving circuit according to some embodiments of the present disclosure.

FIG. 7 is a timing diagram for operation of a display driving circuit according to some embodiments of the present disclosure. In some embodiments, referring to FIG. 7, a period S1 for displaying one frame of image includes a display period S2, a blank period S3, and a supplemental period S4. During the display period S2, the source auxiliary control signal provided by the source auxiliary control signal terminal SC is at a low level, the second switch transistor T2 is turned off, and the source auxiliary control signal from the source auxiliary control signal terminal SC is inverted by the operational amplifier 3 into a signal of a high level which is then output to the control electrode (e.g., a gate) of the first switch transistor T1, whereby the first switch transistor T1 is turned on, and the second data signal terminal Data_out outputs the first data signal provided by the first data signal terminal Data_in for displaying an image. After the display period S2, the blank period S3 starts. At this time, the source auxiliary control signal terminal SC continues outputting the source auxiliary control signal of the low level, the second switch transistor T2 is still turned off, the first switch transistor T1 is still turned on, and the second data signal terminal Data_out keeps outputting the first data signal provided from the first data signal terminal Data_in, thereby ensuring complete input of the first data signal for displaying one frame of image. In some embodiments, the duration of the blank period S3 may be two times as long as the period of the clock signal in the gate driver, thereby shortening the blank period S3 without affecting display continuity. After the blank period S3, the supplemental period S4 starts. At this time, the source auxiliary control signal terminal SC provides the source auxiliary control signal of a high level, the second switch transistor T2 is turned on, the source auxiliary control signal from the source auxiliary control signal terminal SC is inverted by the operational amplifier 3 into a signal of a low level which is then output to the control electrode of the first switch transistor T1, and the first switch transistor T1 is turned off, so that the second data signal terminal Data_out outputs the common voltage signal provided by the common voltage signal terminal Vcom. In the case where all gate lines are enabled and a common voltage signal is provided to all data lines, all sub-pixels in the display area of the display panel are charged, so that the pixel electrode voltage is equal to the common voltage, thus eliminating the DC bias voltage, avoiding accumulation of DC residual voltage and eliminating image sticking. In some embodiments, the duration of the supplemental period S4 is not limited as long as the voltage supplement function can be implemented. For example, the duration of the supplemental period S4 may be two times as long as the period of the clock signal in the gate driver, so as to avoid affecting the display effect.

It should be noted that the inversion of the source auxiliary control signal is not limited to the circuit structure shown herein, and equivalent replacement of the circuit structure that can achieve the same function can be made by those skilled in the art as needed. It should also be noted that the first switch transistor T1 is not limited to be controlled by inverting the source auxiliary control signal, and technical means that can achieve same effect in the field, for example, using a switch transistor having a polarity opposite to that of the second switch transistor T2, may be adopted.

Figure 4:
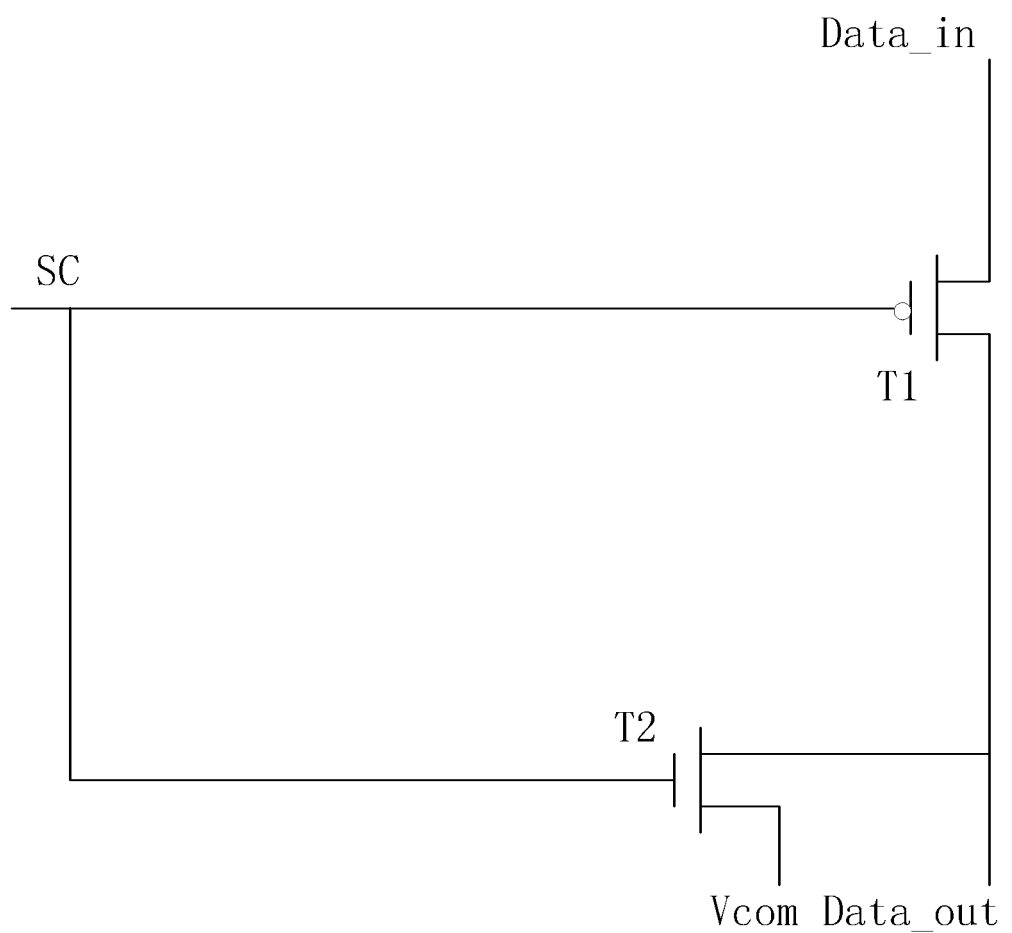
FIG. 4 is a schematic diagram illustrating a source auxiliary circuit according to some embodiments of the present disclosure.

In some embodiments, as shown in FIG. 4, the source auxiliary circuit includes a first switch transistor T1 and a second switch transistor T2, and the first switch transistor T1 and the second switch transistor T2 have different conductivity types. The control electrode of the first switch transistor T1 is coupled to the source auxiliary control signal terminal SC that provides the source auxiliary control signal, the first electrode of the first switch transistor T1 is coupled to the first data signal terminal Data_in that provides the first data signal, and the second electrode of the first switch transistor T1 is coupled to the second data signal terminal Data_out that provides the second data signal. The control electrode of the second switch transistor T2 is coupled to the source auxiliary control signal terminal SC, the first electrode of the second switch transistor T2 is coupled to the second data signal terminal Data_out, and the second electrode of the second switch transistor T2 is coupled to the common voltage signal terminal Vcom that provides the common voltage signal.

As used herein, "same conductivity type" means that the turn-on levels of the switch transistors are the same, and "different conductivity types" means that the turn-on levels of the switch transistors are opposite to each other.

Figure 5:
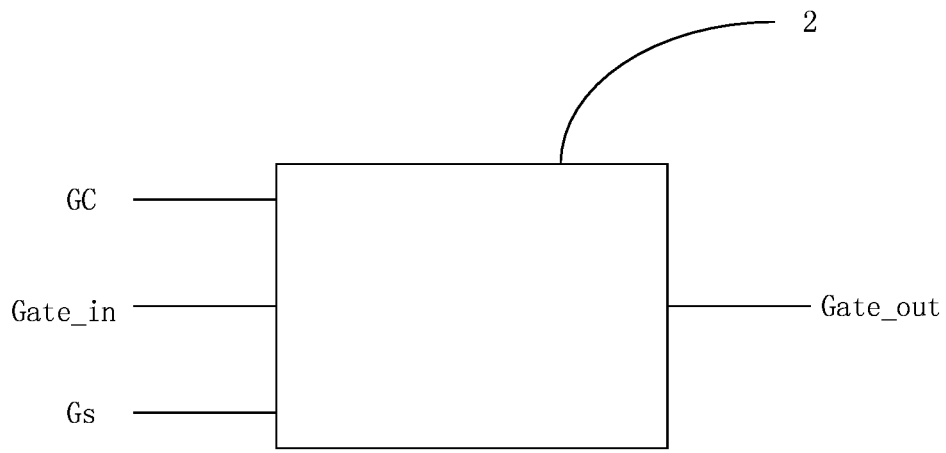
FIG. 5 is a schematic diagram illustrating a gate auxiliary circuit according to some embodiments of the present disclosure.

FIG. 5 is a schematic diagram illustrating a gate auxiliary circuit 2 according to some embodiments of the present disclosure. In some embodiments, referring to FIG. 5, the gate auxiliary circuit 2 is configured to output a second scan signal to the display area of the display panel in response to the gate auxiliary control signal, the first scan signal, and the gate supplemental signal. In some embodiments, the gate auxiliary circuit 2 shown in FIG. 5 can be implemented as the circuit structure shown in FIG. 6.

Figure 6:
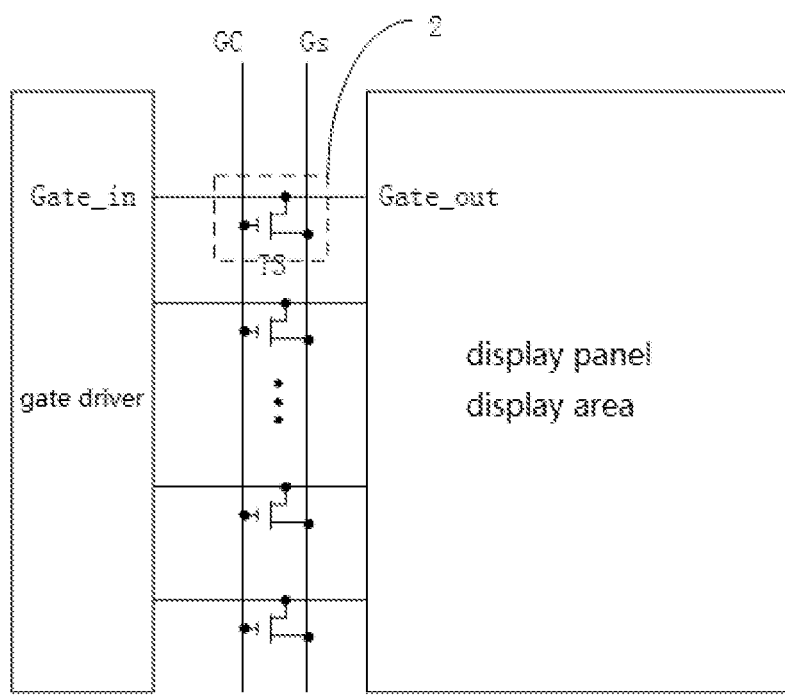
FIG. 6 is a schematic diagram illustrating a gate auxiliary circuit according to some embodiments of the present disclosure.

FIG. 6 is a schematic diagram illustrating a gate auxiliary circuit according to some embodiments of the present disclosure. In some embodiments, as shown in FIG. 6, the gate auxiliary circuit 2 may include a third switch transistor T3, a control electrode (e.g., a gate) of the third switch transistor T3 is coupled to a gate auxiliary control signal terminal GC that provides a gate auxiliary control signal, a first electrode of the third switch transistor T3 is coupled to the gate supplemental signal terminal Gs that provides the gate supplemental signal, and a second electrode of the third switch transistor T3 is coupled to the second scan signal terminal Gate_out that provides the second scan signal. The second scan signal terminal Gate_out is coupled to the first scan signal terminal Gate_in.

The operation principle of the gate auxiliary circuit 1 shown in FIG. 6 will be further explained below with reference to FIG. 8.

Figure 8:
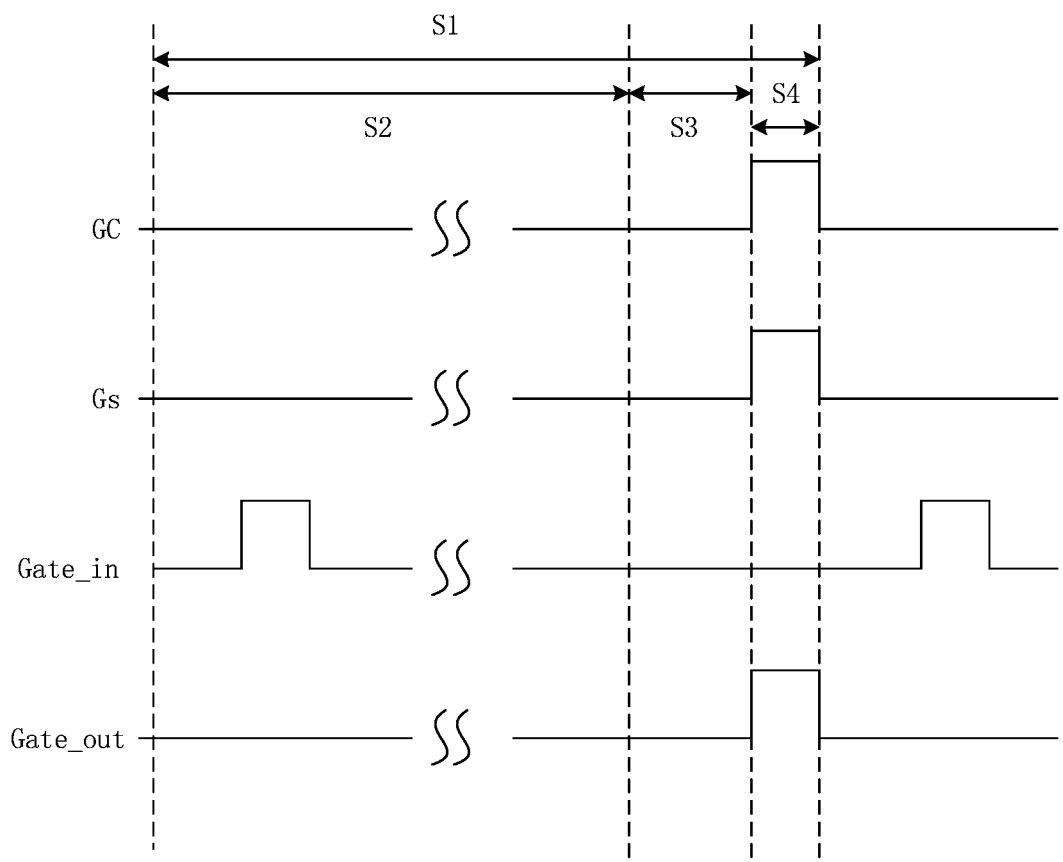
FIG. 8 is a timing diagram for operation of a display driving circuit according to some embodiments of the present disclosure.

FIG. 8 is a timing diagram for operation of a display driving circuit according to some embodiments of the present disclosure. In some embodiments, referring to FIG. 8, a period S1 for displaying one frame of image includes a display period S2, a blank period S3, and a supplemental period S4. During the display period S2, the gate auxiliary control signal provided by the gate auxiliary control signal terminal GC is at a low level, the third switch transistor T3 is turned off, and the second scan signal terminal Gate_out outputs a first scan signal provided by the first scan signal terminal Gate_in. After the display period S2, the blank period S3 starts. At this time, the gate auxiliary control signal terminal GC continues outputting the gate auxiliary control signal of the low level, the third switch transistor T3 is still turned off, and the second scan signal terminal Gate_out outputs the first scan signal provided by the first scan signal terminal Gate_in, thereby ensuring the complete input of the first data signal for displaying one frame of image. In some embodiments, the duration of the blank period S3 may be two times as long as the period of the clock signal in the gate driver, thereby shortening the blank period S3 without affecting display continuity. After the blank period S3, the supplementary period S4 starts. At this time, the gate auxiliary control signal terminal GC provides the gate auxiliary control signal of a high level, the third switch transistor T3 is turned on, and the first scan signal terminal Gate_in provides the first scan signal of a low level, so that the second scan signal terminal Gate_out outputs the gate supplement signal provided by the gate supplemental signal terminal Gs. In the case where the gate supplemental signal terminal Gs outputs the gate supplemental signal of a high level, the second scan signal terminal Gate_out outputs a second scan signal of a high level, and all gate lines of the display panel are enabled. In some embodiments, the duration of the supplemental period S4 is not limited as long as the voltage supplement function can be implemented. For example, the duration of the supplemental period S4 may be two times as long as the period of the clock signal in the gate driver, so as to avoid affecting the display effect.

It should be noted that, in addition to the third switch transistor T3 shown in FIG. 6, the gate auxiliary circuit 1 may have any suitable circuit structure that can realize the same function as that of the third switch transistor T3. In some embodiments, the gate auxiliary circuit 2 may have the same circuit structure as the source auxiliary circuit 1, except that the gate auxiliary circuit 2 is controlled by the gate auxiliary control signal to selectively output one of the data signal and the common voltage signal, and the source auxiliary circuit 1 is controlled by the source auxiliary control signal to selectively output one of the scan signal and the active level signal. For example, the gate auxiliary circuit 2 may have the circuit structure shown in FIG. 3. It should also be noted that the gate supplemental signal may employ any suitable signal timing in which a high level signal is output to the second scan signal terminal Gate_out when the third switch transistor is turned on, in addition to the signal timing shown in FIG. 8. In some embodiments, the gate supplemental signal and the gate auxiliary control signal may be a same signal.

Figure 9:
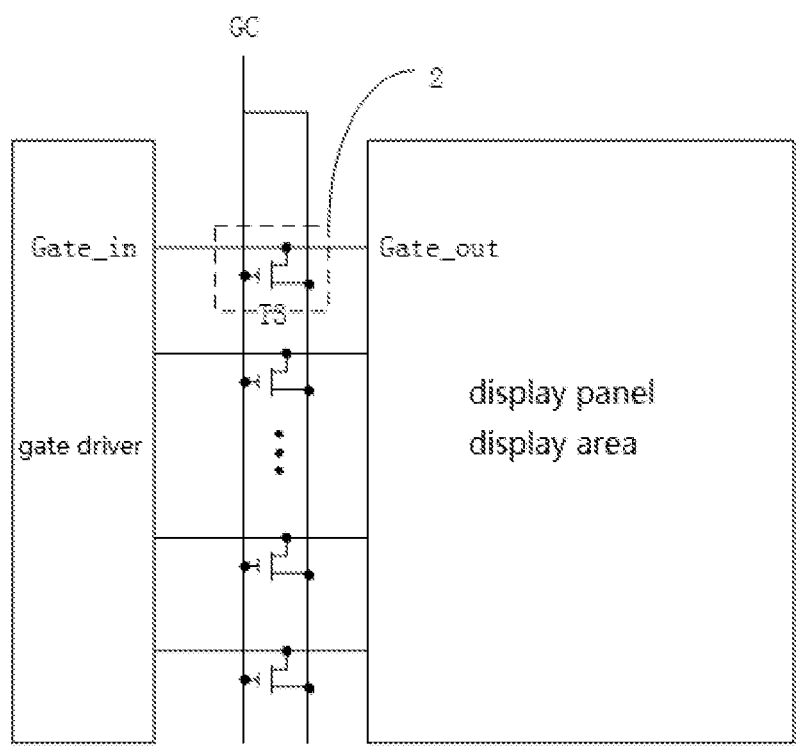
FIG. 9 is a schematic diagram illustrating a gate auxiliary circuit according to some embodiments of the present disclosure.

FIG. 9 is a schematic diagram illustrating a gate auxiliary circuit according to some embodiments of the present disclosure. In some embodiments, referring to FIG. 9, both the gate supplemental signal and the gate auxiliary control signal may be the signal output by the gate auxiliary control signal terminal GC, and the timing diagram is as shown in FIG. 8.

In some embodiments, the source auxiliary control signal and the gate auxiliary control signal may be a signal output from a same signal terminal.

It should be noted that the transistors used in the embodiments of the present disclosure may each be a thin film transistor or a field effect transistor or other switching device having the same characteristics. In the embodiments of the present disclosure, a thin film transistor is taken as an example for description. The source and drain of the transistor used herein may be structurally symmetrical, so that the source and the drain may be structurally indistinguishable. In an embodiment of the present disclosure, in order to distinguish the two electrodes of the transistor except the gate, one is directly described as the first electrode and the other is described as the second electrode. In some embodiments, the first switch transistor T1, the second switch transistor T2 and the third switch transistor T3 may be N-type transistors or P-type transistors, respectively. In the embodiments shown in FIGS. 3 and 6, the first switch transistor T1, the second switch transistor T2, and the third switch transistor T3 are all N-type transistors.

In some embodiments, one of the first switch transistor T1 and the second switch transistor T2 is an N-type transistor and the other thereof is a P-type transistor; and the third switch transistor T3 may be an N-type transistor or a P-type transistor.

Further, in the case of an N-type transistor, the first electrode of the transistor is the drain and the second electrode of the transistor is the source. In the case of a P-type transistor, the first electrode of the transistor is the source and the second electrode of the transistor is the drain. The present disclosure does not limit the type of the transistor.

In another aspect, the present disclosure provides a driving method of a display panel.

In some embodiments, the period for displaying one frame of image includes a display period for displaying the image and a supplemental period after the display period. In some embodiments, the display panel includes a plurality of sub-pixels, each sub-pixel including a pixel electrode and a common electrode provided with a common voltage signal.

In some embodiments, the method includes providing the common voltage signal to the pixel electrode of each sub-pixel during the supplemental period. In some embodiments, the scan signal is sequentially provided to the gate lines and the data signals are transmitted to the data lines during the display period; an active level signal is provided to all of the gate lines to enable all the gate lines and the common voltage signal is transmitted to the data lines during the supplemental period after the display period.

In some embodiments, the display driver circuit according to the present disclosure can be used to drive a display panel. In some embodiments, during a display period, the source auxiliary circuit provides a data signal from the source driver to the display panel in response to the source auxiliary control signal, and the gate auxiliary circuit provides a scan signal from the gate driver to the display panel in response to the gate auxiliary control signal, so that the display panel displays an image; during the supplemental period, the source auxiliary circuit provides the common voltage signal to the display panel in response to the source auxiliary control signal, and the gate auxiliary circuit provides the active level signal to the display panel in response to the gate auxiliary control signal, to provide the common voltage signal to the pixel electrode of each sub-pixel. For specific driving method, FIG. 7 and FIG. 8 may be referred and no description will be given here in order to avoid repetition.

In another aspect, the present disclosure provides a display panel including the display driving circuit described herein and a display device using the same. It should be noted that the display device may be any product or component having a display function, such as a liquid crystal television, a display, an electronic paper display device, a mobile phone, a tablet computer, a notebook computer, a digital photo frame, a navigator, and the like. The display device may also include other conventional components such as a display panel, which is not limited by the embodiments of the present disclosure.

There are a few points to be noted:

(1) The drawings of the embodiments of the present disclosure relate only to the structures related to the embodiments of the present disclosure, and for other structures, reference may be made to the general design.

(2) In the case of no conflict, the embodiments of the present disclosure and the features in the embodiments can be combined with each other to obtain a new embodiment.

The above description only relates to exemplary embodiments of the present disclosure, and is not intended to limit the scope of the disclosure. The scope of the disclosure is determined by the appended claims.

What is claimed is:

1. A display driving circuit, the display driving circuit comprising:
   a source driver configured to output a data signal;
   a source auxiliary circuit, coupled between the source driver and a data line of a display panel, and configured to, in response to a first control signal being in a first level state, output the data signal from the source driver to the data line in a display period for displaying an image, and in response to the first control signal being in a second level state, output a common voltage signal to the data line in a supplemental period, wherein the supplemental period is after the display period, a period for displaying one frame of image comprises the display period and the supplemental period, and the display panel comprises a common electrode supplied with the common voltage signal;
   a gate driver configured to output a scan signal; and
   a gate auxiliary circuit, coupled between the gate driver and a gate line of the display panel, and configured to, in response to a second control signal being in a third level state, output the scan signal from the gate driver, to the gate line in the display period, and in response to the second control signal being in a fourth level state, output an active level signal to the gate line in the supplemental period, the active level signal being a signal enabling a corresponding switch transistor to be turned on; wherein the gate auxiliary circuit comprises a third switch transistor, a control electrode of the third switch transistor being directly coupled to a second control signal terminal that provides the second control signal, a first electrode of the third switch transistor being directly coupled to an active level signal terminal that provides the active level signal, and a second electrode of the third switch transistor being directly coupled to the gate driver.

2. The display driving circuit of claim 1, wherein the source auxiliary circuit comprises an inverter, a first switch transistor and a second switch transistor, the first switch transistor and the second switch transistor having a same conductivity type;
   an input terminal of the inverter is coupled to a first control signal terminal that provides the first control signal;
   a control electrode of the first switch transistor is coupled to an output terminal of the inverter, a first electrode of the first switch transistor is coupled to the source driver, and a second electrode of the first switch transistor is coupled to an output terminal of the source auxiliary circuit; and
   a control electrode of the second switch transistor is coupled to the first control signal terminal, a first electrode of the second switch transistor is coupled to the output terminal of the source auxiliary circuit, and a second electrode of the second switch transistor is coupled to a common voltage signal terminal that provides the common voltage signal.

3. The display driving circuit of claim 2, wherein the inverter comprises a first resistor, a second resistor, a third resistor, an operational amplifier, and a first capacitor;
   a first terminal of the first resistor is coupled to the first control signal terminal, and a second terminal of the first resistor is coupled to an inverting input terminal of the operational amplifier;
   a first terminal of the second resistor is coupled to a first terminal of the first capacitor and the inverting input terminal of the operational amplifier, and a second terminal of the second resistor is coupled to a second terminal of the first capacitor and an output terminal of the operational amplifier;
   a first terminal of the third resistor is coupled to a non-inverting input terminal of the operational amplifier, and a second terminal of the third resistor is grounded; and
   the output terminal of the operational amplifier is coupled to the control electrode of the first switch transistor.

4. The display driving circuit of claim 1, wherein the source auxiliary circuit comprises a first switch transistor and a second switch transistor, the first switch transistor and the second switch transistor having different conductivity types;
   a control electrode of the first switch transistor is coupled to a first control signal terminal that provides the first control signal, a first electrode of the first switch transistor is coupled to the source driver, and a second electrode of the first switch transistor is coupled to an output terminal of the source auxiliary circuit; and
   a control electrode of the second switch transistor is coupled to the first control signal terminal, a first electrode of the second switch transistor is coupled to the output terminal of the source auxiliary circuit, and a second electrode of the second switch transistor is coupled to a common voltage signal terminal that provides the common voltage signal.

5. The display driving circuit of claim 1, wherein the gate auxiliary circuit comprises a third switch transistor, a control electrode and a first electrode of the third switch transistor being coupled to a second control signal terminal that provides the second control signal, and a second electrode of the third switch transistor being coupled to the gate driver.

6. The display driving circuit of claim 1, wherein the source auxiliary circuit and the gate auxiliary circuit have a same circuit structure.

7. The display driving circuit of claim 1, wherein
the first control signal and the second control signal are a same signal.

8. The display driving circuit of claim 1, wherein
the gate driver comprises N cascaded shift register units, each of which comprises one scan signal terminal, where N is an integer greater than 2, and
the gate driver outputs the scan signal through the scan signal terminal.

9. The display driving circuit of claim 1, wherein
the source auxiliary circuit comprises a first resistor, a second resistor, a third resistor, a first switch transistor, a second switch transistor, an operational amplifier and a first capacitor, the first switch transistor and the second switch transistor have a same conductivity type, and the gate auxiliary circuit comprises a third switch transistor;
a first terminal of the first resistor is coupled to a first control signal terminal that provides the first control signal, and a second terminal of the first resistor is coupled to an inverting input terminal of the operational amplifier;
a first terminal of the second resistor is coupled to a first terminal of the first capacitor and the inverting input terminal of the operational amplifier, and a second terminal of the second resistor is coupled to a second terminal of the first capacitor and an output terminal of the operational amplifier;
a first terminal of the third resistor is coupled to a non-inverting input terminal of the operational amplifier, and a second terminal of the third resistor is grounded;
a control electrode of the first switch transistor is coupled to the output terminal of the operational amplifier, a first electrode of the first switch transistor is coupled to the source driver, and a second electrode of the first switch transistor is coupled to an output terminal of the source auxiliary circuit;
a control electrode of the second switch transistor is coupled to the first control signal terminal, a first electrode of the second switch transistor is coupled to the output terminal of the source auxiliary circuit, a second electrode of the second switch transistor is coupled to a common voltage signal terminal that provides the common voltage signal; and
a control electrode of the third switch transistor is coupled to a second control signal terminal that provides the second control signal, a first electrode of the third switch transistor is coupled to an active level signal terminal that provides the active level signal, and a second electrode of the third switch transistor is coupled to the gate driver.

10. A display panel, comprising the display driving circuit of claim 1.

11. A display device, comprising the display panel of claim 10.

12. A driving method of a display panel, comprising a display period for displaying an image and a supplemental period after the display period, the display panel comprising a plurality of sub-pixels which each comprising a pixel electrode and a common electrode that is supplied with a common voltage signal, the driving method comprising:
providing an active level signal to all gate lines of the display panel and providing the common voltage signal to all data lines of the display panel, so as to provide the common voltage signal to all the pixel electrodes during the supplemental period; wherein the display panel is driven by a display driving circuit, the display driving circuit comprising a source driver, a gate driver, a source auxiliary circuit and a gate auxiliary circuit; during the display period, the source auxiliary circuit, coupled between the source driver and the data lines of the display panel, provides a data signal from the source driver to the display panel in response to a first control signal, and the gate auxiliary circuit provides a scan signal from the gate driver to the display panel in response to a second control signal, so that the display panel displays an image; and during the supplemental period, the source auxiliary circuit provides the common voltage signal to the display panel in response to the first control signal, and the gate auxiliary circuit provides an active level signal to the display panel in response to the second control signal, to provide the common voltage signal to the pixel electrode of each sub-pixel; wherein the gate auxiliary circuit comprises a third switch transistor, a control electrode of the third switch transistor being directly coupled to a second control signal terminal that provides the second control signal, a first electrode of the third switch transistor being directly coupled to an active level signal terminal that provides the active level signal, and a second electrode of the third switch transistor being directly coupled to the gate driver.

13. The driving method of claim 12, wherein
the source auxiliary circuit comprises an inverter, a first switch transistor and a second switch transistor, the first switch transistor and the second switch transistor having the same conductivity type;
an input terminal of the inverter is coupled to a first control signal terminal that provides the first control signal;
a control electrode of the first switch transistor is coupled to an output terminal of the inverter, a first electrode of the first switch transistor is coupled to the source driver, a second electrode of the first switch transistor is coupled to an output terminal of the source auxiliary circuit; and
a control electrode of the second switch transistor is coupled to the first control signal terminal, a first electrode of the second switch transistor is coupled to the output terminal of the source auxiliary circuit, a second electrode of the second switch transistor is coupled to a common voltage signal terminal that provides the common voltage signal.

14. The driving method of claim 13, wherein
the inverter comprises a first resistor, a second resistor, a third resistor, an operational amplifier, and a first capacitor;
a first terminal of the first resistor is coupled to the first control signal terminal, and a second terminal of the first resistor is coupled to an inverting input terminal of the operational amplifier;
a first terminal of the second resistor is coupled to a first terminal of the first capacitor and the inverting input terminal of the operational amplifier, and a second terminal of the second resistor is coupled to a second terminal of the first capacitor and an output terminal of the operational amplifier;
a first terminal of the third resistor is coupled to a non-inverting input terminal of the operational amplifier, and a second terminal of the third resistor is grounded; and
the output terminal of the operational amplifier is coupled to the control electrode of the first switch transistor.

15. The driving method of claim 12, wherein
the source auxiliary circuit comprises a first switch transistor and a second switch transistor, the first switch transistor and the second switch transistor having different conductivity types;
a control electrode of the first switch transistor is coupled to a first control signal terminal that provides the first control signal, a first electrode of the first switch transistor is coupled to the source driver, and a second electrode of the first switch transistor is coupled to an output terminal of the source auxiliary circuit; and
a control electrode of the second switch transistor is coupled to the first control signal terminal, a first electrode of the second switch transistor is coupled to the output terminal of the source auxiliary circuit, and a second electrode of the second switch transistor is coupled to a common voltage signal terminal that provides the common voltage signal.

16. The driving method of claim 12, wherein
the gate auxiliary circuit comprises a third switch transistor, a control electrode and a first electrode of the third switch transistor being coupled to a second control signal terminal that provides the second control signal, and a second electrode of the third switch transistor being coupled to the gate driver.

17. The driving method of claim 12, wherein
the first control signal and the second control signal are a same signal.

* * * * *